(12) United States Patent
Chia et al.

(10) Patent No.: US 9,484,916 B1
(45) Date of Patent: Nov. 1, 2016

(54) ADAPTIVE ON-CHIP TERMINATION CIRCUITRY

(71) Applicant: Altera Corporation, San Jose, CA (US)

(72) Inventors: Hooi Yang Chia, Bayan Lepas (MY); Joseph Kho Boon Hock, Mukah (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/658,656

(22) Filed: Mar. 16, 2015

(51) Int. Cl.
| | |
|---|---|
| *H03K 19/0175* | (2006.01) |
| *H03K 19/00* | (2006.01) |
| *H04L 25/02* | (2006.01) |
| *G06F 13/40* | (2006.01) |

(52) U.S. Cl.
CPC ....... *H03K 19/0005* (2013.01); *G06F 13/4086* (2013.01); *H04L 25/028* (2013.01); *H04L 25/0278* (2013.01)

(58) Field of Classification Search
CPC .......... G06F 13/4086; H03K 19/0005; H04L 25/0278; H04L 25/028; H04L 25/0298
See application file for complete search history.

(56) References Cited

U.S. PATENT DOCUMENTS

| | | | |
|---|---|---|---|
| 6,118,310 A | 9/2000 | Esch, Jr. | |
| 6,798,237 B1 * | 9/2004 | Wang | H04L 25/0278 326/30 |
| 6,836,144 B1 | 12/2004 | Bui et al. | |
| 6,907,231 B2 | 6/2005 | Bhatti | |
| 6,940,303 B2 | 9/2005 | Vargas | |
| 7,145,413 B2 | 12/2006 | Hsu et al. | |
| 7,215,932 B2 | 5/2007 | Bhatti | |
| 7,420,386 B2 | 9/2008 | Wang et al. | |
| 7,538,573 B2 * | 5/2009 | Kim | H03K 19/0005 326/30 |
| 7,961,001 B1 * | 6/2011 | Ko | G11C 7/02 326/26 |
| 8,390,317 B2 * | 3/2013 | Bae | G11C 7/1051 326/30 |
| 8,457,579 B2 * | 6/2013 | Mishali | H04B 1/0092 455/130 |
| 8,947,119 B2 * | 2/2015 | Jang | H03K 17/16 326/30 |
| 9,048,824 B2 * | 6/2015 | Chan | H03K 19/0005 |
| 2008/0211534 A1 * | 9/2008 | Jeong | G11O 5/063 326/30 |
| 2011/0241653 A1 * | 10/2011 | Kim | H03K 19/0005 324/76.83 |

* cited by examiner

*Primary Examiner* — Jason M Crawford
*Assistant Examiner* — Kurtis R Bahr
(74) *Attorney, Agent, or Firm* — Treyz Law Group; Jason Tsai

(57) ABSTRACT

An integrated circuit with on-chip termination (OCT) circuitry is provided. In particular, the integrated circuit may include an input-output (IO) buffer, an OCT circuit coupled between the IO buffer and a physical IO interface, and adaptive external OCT calibration circuitry for impedance matching the IO buffer to a transmission line that is coupled to the IO buffer. The adaptive external OCT calibration circuitry may include a waveform measurement circuit for selectively sampling a waveform at the IO interface, and a waveform analyzer and control circuit for analyzing the sampled waveform and adjusting the OCT circuit until the impedance provided by the OCT circuit matches with the external impedance of the transmission line. A switch that is interposed between the OCT circuit and the measurement module may be enabled during calibration and disabled during normal device operation.

18 Claims, 6 Drawing Sheets

ADAPTIVE ON-CHIP TERMINATION CIRCUITRY

BACKGROUND

This relates generally to communications links, and more particularly, to high-speed input-output (I/O) communications links.

A typical communications link includes a transmitter, a receiver, and a channel that connects the transmitter to the receiver. The transmitter in one integrated circuit transmits a serial data bit stream to the receiver in another integrated circuit via the channel. Typical high-speed transmit data rates are 1 Gbps (gigabits per second) to 10 Gbps. Communications links operating at such high data rates are often referred to as high-speed serial links or high-speed input-output links.

In general, it is desirable to match the impedance of the transceiver (i.e., the transmitter and the receiver) with the impedance of one or more off-chip transmission lines serving as the channel to optimize signal integrity. In practice, however, the characteristic impedance of the transmission lines such as metal traces on a printed circuit board (PCB) is subject to variations due to PCB manufacturing defects (i.e., PCB traces often exhibit impedances that deviate from target impedance levels), PCB characteristic degradation due to semiconductor aging effects, environment effects from changes in temperature and humidity, and other sources of random/systematic variations.

In an effort to compensate for possible impedance mismatch with external traces, conventional integrated circuits are typically provided with an on-chip termination circuit at the transceiver. The on-chip termination circuit is configured to provide a fixed set of impedance values that is capable of supporting high speed communications using common industry communications standards. For example, the on-chip termination circuit can be configured to provide an impedance selected from one of 85 Ω, 100 Ω, 120Ω, and 150Ω. During device startup, one of these on-chip termination settings that provides the minimum amount of impedance mismatch may be selected. However, since the transmission line impedance in reality varies over time, it is challenging to achieve perfect impedance match using a fixed on-chip termination value.

SUMMARY

An integrated circuit that includes input-output circuitry configured to support high-speed communications is provided. In particular, the integrated circuit may include an input-output (IO) buffer that communicates with an external transmission line (e.g., a trace on a printed circuit board) via a physical IO interface, an on-chip impedance termination (OCT) circuit, an initial settings register, and adaptive OCT calibration circuitry that dynamically adjusts the impedance of the OCT circuit until the termination impedance of the OCT circuit is matched with the impedance of the external transmission line. The IO buffer may sometimes be referred to as an external interface buffer.

The adaptive OCT calibration circuitry may include at least a measurement circuit, a waveform analyzer and controller circuit, and a summing circuit. The measurement circuit can be used to monitor or characterize the impedance of the external transmission line and the impedance of the OCT circuit (e.g., to determine whether the impedance of the external transmission line is less than or greater than the termination impedance of the OCT circuit). The measurement circuit can be configured to sample an impulse response waveform at the physical or "external" interface to determine whether the two impedances are matched. For example, the impedance of the OCT circuit can be increased in response to detecting that the impulse response has a first characteristic or can be decreased in response to detecting that the impulse response has a second characteristic that is different than the first characteristic.

The control circuitry can also be used to selectively enable a switch that is coupled between the OCT circuit and the measurement circuit only during calibration. The initial settings register may be used to store coarse impedance tuning settings for the OCT circuit. The control circuitry may be used to generate fine impedance tuning settings that have finer impedance tuning granularity (or accuracy) than the coarse settings. The summing circuit may be used to combine the coarse impedance tuning settings with the fine impedance tuning settings based on the sampled waveform.

Further features of the present invention, its nature and various advantages will be more apparent from the accompanying drawings and the following detailed description.

DETAILED DESCRIPTION

Embodiments of the present invention relate to communications links, and more particularly, to methods for improving the performance of communications links. It will be recognized by one skilled in the art, that the present exemplary embodiments may be practiced without some or all of these specific details. In other instances, well-known operations have not been described in detail in order not to unnecessarily obscure the present embodiments.

Communications links are commonly used to convey data between separate integrated circuits packages, printed circuit boards, etc. Such communications links may be used to connect integrated circuits that include communications capabilities, such as memory chips, digital signal processing circuits, microprocessors, application specific integrated circuits, programmable logic device integrated circuits, field-programmable gate arrays, application specified standard products, or any other suitable integrated circuit.

Figure 1:
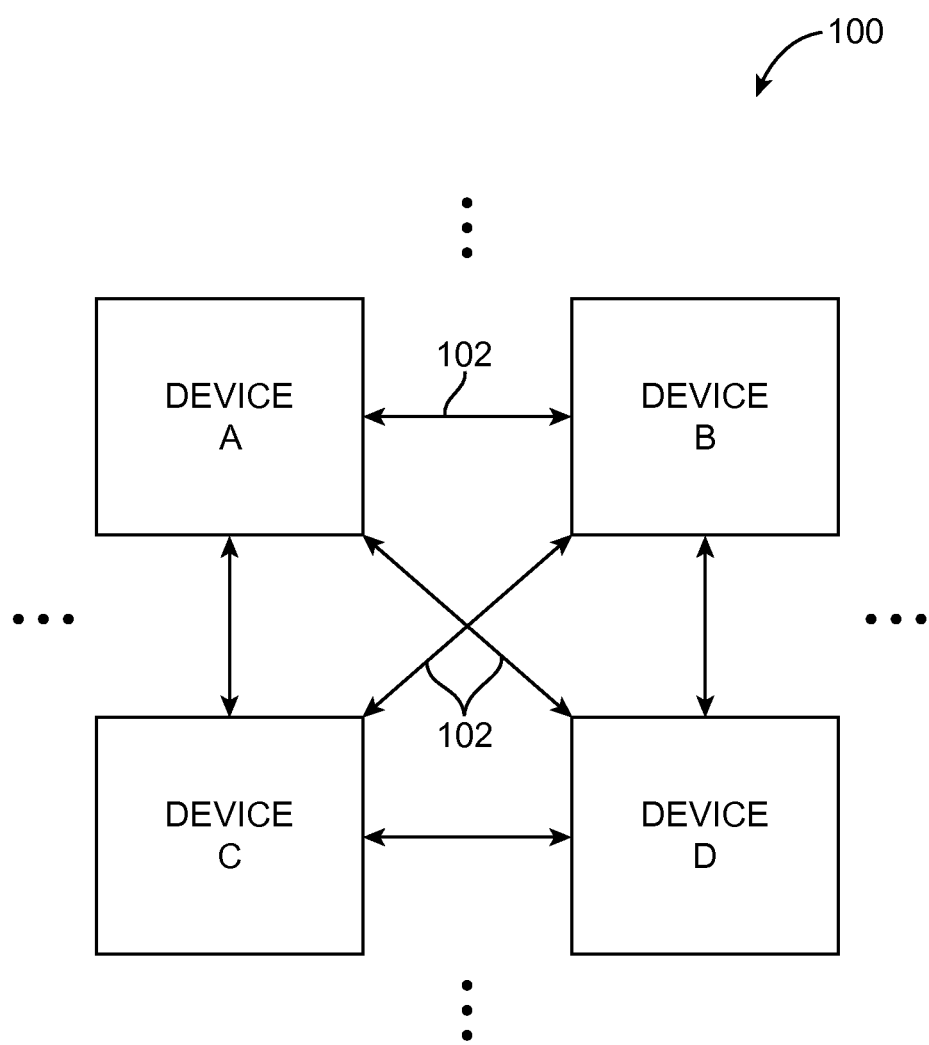
FIG. 1 is a diagram of an illustrative system of integrated circuit devices operable to communicate with one another in accordance with an embodiment.

An illustrative system 100 of interconnected electronic devices is shown in FIG. 1. The system of interconnected electronic devices may have multiple electronic devices such as device A, device B, device C, device D, and interconnection resources 102. Interconnection resources 102 such as conductive lines and busses, optical interconnect infrastructure, or wired and wireless networks with optional intermediate switching circuitry may be used to send signals from one electronic device to another electronic device or to broadcast information from one electronic device to multiple other electronic devices. For example, a transmitter in device B may transmit data signals to a receiver in device C. Similarly, device C may use a transmitter to transmit data to a receiver in device B.

The electronic devices may be any suitable type of electronic device that communicates with other electronic devices. Examples of such electronic devices include basic electronic components and circuits such as analog circuits, digital circuits, mixed-signal circuits, circuits formed within a single package, circuits housed within different packages, circuits that are interconnected on a printed-circuit board (PCB), etc.

Figure 2:
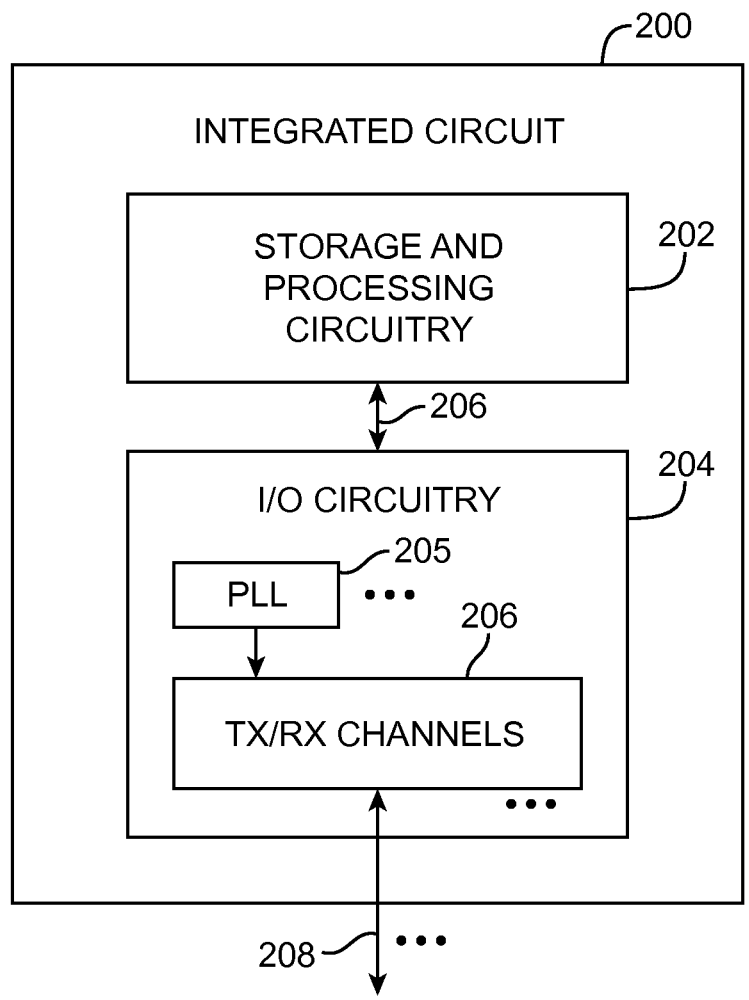
FIG. 2 a diagram of an illustrative integrated circuit that includes input-output circuitry in accordance with an embodiment.

An illustrative embodiment of an integrated circuit 200 in accordance with the present invention is shown in FIG. 2. Integrated circuit 200 may include storage and processing circuitry 202 and input-output (IO) circuitry 204. Storage and processing circuitry 202 may include embedded microprocessors, digital signal processors (DSP), arithmetic circuitry, logic circuitry, microcontrollers, or other processing circuitry. The storage and processing circuitry 202 may further include random-access memory (RAM), first-in first-out (FIFO) circuitry, stack or last-in first-out (LIFO) circuitry, read-only memory (ROM), or other memory elements. Internal interconnection resources 206 such as conductive lines and busses may be used to send data from one component to another component or to broadcast data from one component to one or more other components within device 200. External interconnection resources 208 such as conductive lines and busses, optical interconnect infrastructure, or wired and wireless networks with optional intermediate switches may be used to communicate with other devices (see, system 100 of FIG. 1).

IO circuitry 204 may, for example, be a high-speed serial interface (or HSSI) circuit that receive serial data from external interconnection resources 208 and that deserializes the serial data before sending parallel data over internal interconnection resources 206 to storage and processing circuitry 202. High-speed serial interface circuitry 204 may also receive data from storage and processing circuitry 202 over internal interconnection resources 206, serialize the received data, and transmit the serial data over external interconnection resources 208.

IO circuitry 204 may include differential buffer circuitry, serial data transceiver circuitry such as receive (Rx) and transmit (Tx) channels 206 and associated phase-locked loop (PLL) circuitry 205, and/or other suitable communications circuitry for transmitting and receiving data. The PLL circuitry 205 may be used to generate clock signals for clocking one or more buffers within the Tx/Rx channels 206. IO circuitry 204 may also be provided with physical media attachment (PMA) layer circuitry which may include one or more Rx/Tx channels 206 for receiving and transmitting data. Each channel 206 may have a serializer/deserializer (SerDes), pre-emphasis and equalization circuitry, or clock data recovery (CDR) circuitry. Each channel 206 may optionally include physical coding sublayer (PCS) circuitry which may include word aligner circuitry, rate matching first-in first-out circuitry, 8 bit/10 bit encoding and decoding circuitry, etc.

The example described herein where IO circuitry 204 is used to support high speed serial communications is merely illustrative and does not serve to limit the scope of the present invention. If desired, IO circuitry 204 may be used to support parallel data transmission, single-data-rate communications, double-data-rate communications, single-ended-signaling standards, differential-signaling standards, standard-voltage communications protocols, low-voltage communications protocols, etc.

Data signals that are being conveyed from one integrated circuit device to another via a communications channel are often characterized by an overall link metric. The overall link metric may be a bit error rate (BER), as an example. Bit error rate may be defined as the ratio of the number of error bits (e.g., received bits that have been corrupted by noise, jitter, interference, etc.) to the total number of transmitted bits within a given time period.

For example, consider a scenario in which two terabits were transmitted within five seconds. There may be two incorrect bits that were transferred erroneously. The BER is therefore $10^{-12}$ (2 divided by $2*10^{12}$). For high-speed communications system such as system 100, it may be desirable to set the BER to $10^{-12}$ or smaller (e.g., $10^{-13}$, $10^{-15}$, $10^{-18}$, etc.).

Figure 3:
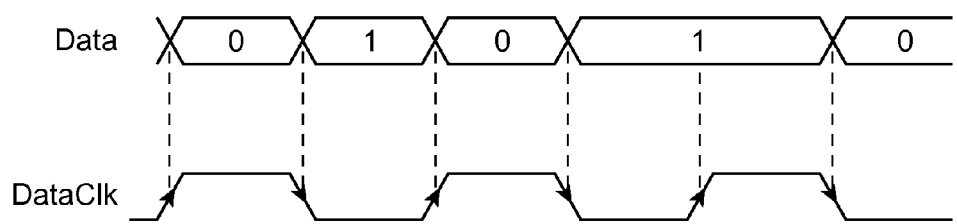
FIG. 3 is a diagram showing a half-rate data transmission scheme in accordance with an embodiment.

FIG. 3 is a diagram showing an illustrative serial data bit stream that can be transmitted via a given channel. A half-rate transceiver arrangement is shown in FIG. 3 in which the serial data bit stream having data bits "010110 . . . " toggles at each rising and falling edge of transmit clock signal DataClk. The data bits arriving at a corresponding receiver may be latched using a recovered clock signal that is substantially similar to DataClk (e.g., the recovered clock should exhibit the same frequency as DataClk and should have edges that are phase aligned to the data bit transitions). If desired, the recovered clock signal may be phase shifted by a predetermined amount with respect to the data bits to center the clock edges within each data bit window.

Figure 4:
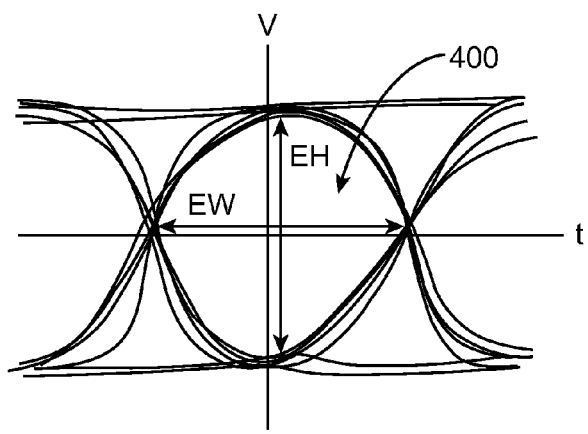
FIG. 4 is an eye diagram of an illustrative data stream in accordance with an embodiment.

FIG. 4 shows an exemplary eye diagram of the transmitted data bits. The eye diagram may be formed by repetitively sampling the incoming data bits at regular time intervals and by overlaying the sampled information. As shown in FIG. 4, the eye diagram displays an eye opening 400 that is characterized by an eye width EW and an eye height EH. Ideally, the eye width is equal to half the clock period of signal DataClk (assuming a half-rate data transmission architecture), whereas the eye height is equal to the full rail differential voltage swing. In practice, however, jitter, noise, variations in operating voltage, variations in operating temperature, and other sources of random variation may reduce the size of eye opening 400. As an example, jitter may cause variation in time, which degrades eye width EW. As another example, noise may cause variation in voltage, which degrades eye height EH.

One of the major factors that impact bit error rate is whether the impedances between the IO circuitry within an integrated circuit and conductive interconnects external to the integrated circuit are properly matched. For example, it may be desirable to match the impedance of a transmitter circuit with the characteristic impedance of a corresponding transmission line (e.g., an external off-chip metal interconnect trace formed on a printed circuit board or other types of channel) that is coupled to the output of that transmitter circuit. In practice, however, the characteristic impedance of the PCB trace (or other channel structures) varies dynamically over time due to PCB manufacturing faults, semiconductor aging, voltage/temperature and other variations in operating conditions, and/or other sources of random/systematic variation.

Figure 5:
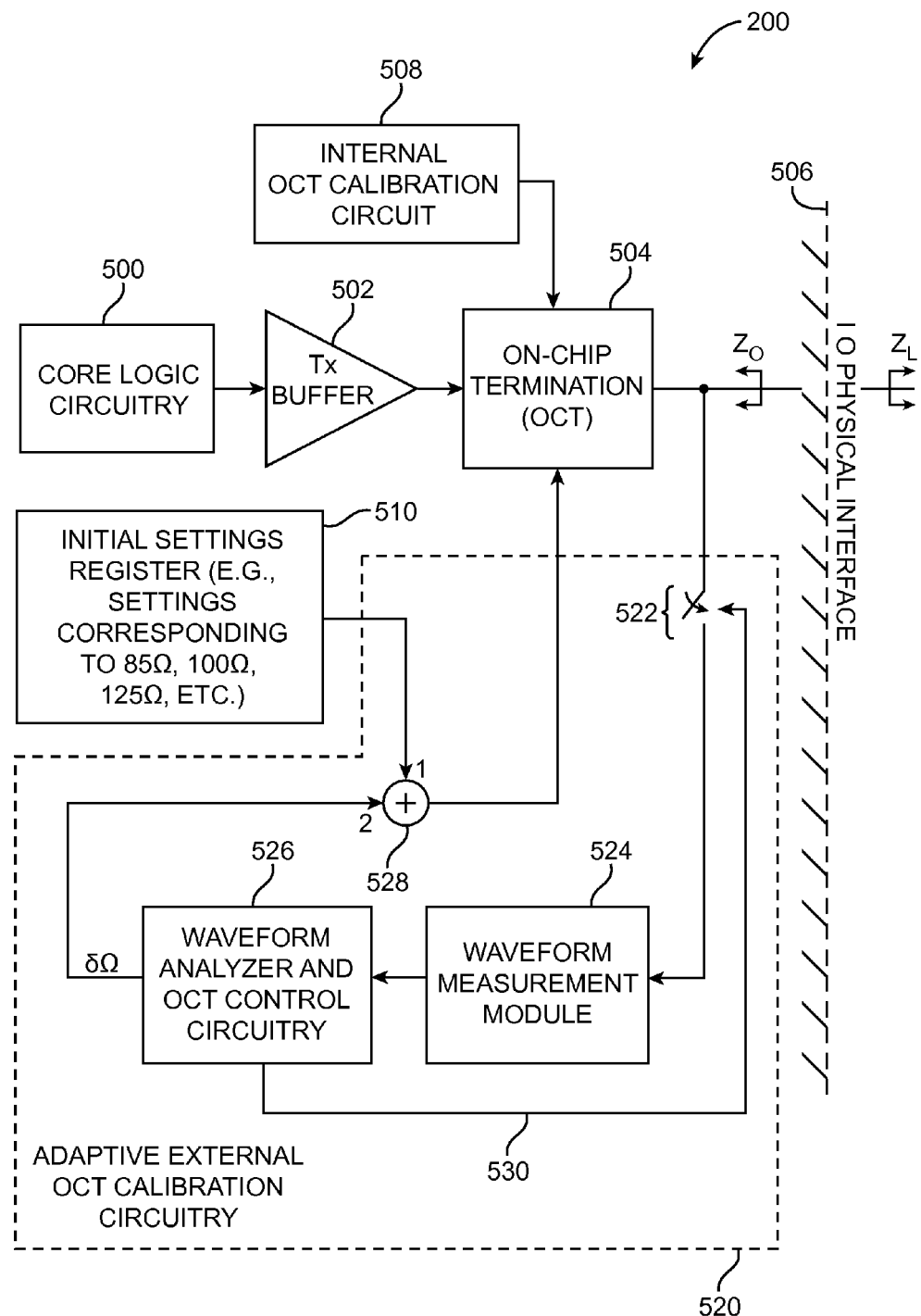
FIG. 5 is a diagram of illustrative input-output circuitry that includes an internal on-chip termination (OCT) calibration circuit and adaptive external OCT calibration circuitry in accordance with an embodiment.

In accordance with an embodiment of the present invention, an integrated circuit such as integrated circuit 200 of FIG. 5 may be provided with adaptive on-chip termination (OCT) calibration circuitry for dynamically tracking the impedances of the communications channel to help reduce impedance mismatch. As shown in FIG. 5, integrated circuit 200 may include core logic circuitry 500 and associated IO circuitry that includes at least an external interface buffer 502 (e.g., a transmit buffer), an on-chip termination (OCT) circuit 504, an internal OCT calibration circuit 508, an initial OCT settings storage circuit 510, and adaptive external OCT calibration circuitry 520. The input-output circuitry may be formed along one or more edges of integrated circuit 200. As described above, the IO circuitry may be used for driving signals off of device 200 and for receiving signals from other external devices via associated IO pins (or "pads"). Each IO pin may, for example, be connected to a power supply line, a data line, a control line, or other signal conductor on a printed circuit board.

Core logic circuitry 500 (sometimes considered to be part of storage and processing circuitry 202 of FIG. 2) may be powered using a relatively lower core power supply voltage Vcc compared to an elevated power supply voltage Vccn that is used to bias the IO circuitry. As a result, the peripheral IO circuitry may include transistor structures which thick gate oxide layers (e.g., gate oxide layers with thicknesses of about 15-30 angstroms), whereas the inner core circuitry 500 may include transistor structures formed using relatively thinner gate oxides (e.g., gate oxide layers with thicknesses of about 5-14 angstroms).

The use of the larger power supply voltage ensures that input and output drivers/buffers in the IO circuitry are able to communicate properly with external circuitry. As an example, the elevated power supply voltage allows output drivers to transmit outgoing data signals at voltage levels that are compliant with commonly used communications standards. These standards may require the use of relatively large signal voltages to increase noise immunity on circuit board busses. If only lower voltages such as Vcc were available to power the input-output drivers, it might be difficult or impossible to interface with other integrated circuits.

In the example of FIG. 5, buffer 502 may serve as an output Tx driver for driving signals off of device 200. On-chip termination circuit 504 may be interposed between transmit buffer 502 and the physical IO interface 506 that delineates the border between internal circuit components and an external channel. The external channel may be a conductive trace on a PCB (as an example) and may have a characteristic channel impedance of $Z_L$. On-chip termination circuit 504 may be configured to provide a corresponding output impedance $Z_O$ that is substantially equal to link impedance $Z_L$ to help maximum power transfer and optimize the signal integrity of data that is being conveyed through the communications link. Circuit 504 may (for example) include capacitors, inductors, resistors, and other passive/active components connected in any desired parallel and/or serial combination.

The initial OCT settings storage circuit 510 may be a register that stores on-chip termination control settings corresponding to a predetermined set of OCT impedance values. For example, register 510 may be directed to output a first control setting that configures OCT circuit 504 to provide an impedance $Z_O$ of 85Ω, to output a second control setting that configures OCT circuit 504 to provide an impedance $Z_O$ of 100Ω, and to output a third control setting that configures OCT circuit 504 to provide an impedance $Z_O$ of 125Ω. These values are merely illustrative. If desired, storage circuit 510 may be configured to store control settings corresponding to less than three impedance values, more than three impedance values, more than four impedance values, more than ten impedance values, etc.

The selection of which initial setting is output by register 510 may be determined using the internal OCT calibration circuit 508. For example, during initial calibration operations, circuit 508 may direct register 510 to output the first control setting in response to detecting that buffer 502 is being used to support a first communications standard that operates most suitably with an impedance of 85Ω. As another example, circuit 508 may direct register 510 to output the third control setting in response to detecting that buffer 502 is being used to support a second communications standard that operates most suitably with an impedance of 125Ω. As yet another example, circuit 508 may direct register 510 to output the second control setting in response to detecting that buffer 502 is being used to support a third communications standard that operates most suitably with an impedance of 100Ω. As described above, the characteristic impedance $Z_L$ of the external transmission line is likely to vary dynamically over time and it may be difficult for the initial OCT setting to provide perfect impedance matching in the presence of the process, voltage, and temperature (PVT) variations. Adaptive OCT calibration circuitry 520 may be used in accordance with at least some embodiments to help calibrate and adaptively change the OCT impedance settings until satisfactory impedance matching is obtained. Because circuitry 520 is adapted to track the actual impedance of the external transmission line or channel, circuitry 520 may therefore sometimes be referred to as "external" OCT calibration circuitry.

Still referring to FIG. 5, adaptive external on-chip termination calibration circuitry 520 may include at least a switch 522, waveform measurement module 524, waveform analyzer and OCT control circuitry 526, and a summing circuit 528. Switch 522 (e.g., one or more transistors, transmission gate, or other type of switching circuit) may be used to selectively couple the OCT circuit 504 to an input of the waveform measurement module 524. Waveform measurement module 524 and waveform analyzer and OCT control circuitry 526 may be coupled in series between switch 522 and summing circuit 528. In particular, summing circuit may have a first (1) input that receives a first set of control signals from initial settings register 510, a second (2) input that receives a second set of control signals from circuitry 526, and an output on which a third set of control signals (e.g., control signals that are generated by combining the first and second set of received control signals) is provided to configure the OCT circuit 504 in the desired state.

Connected in this way, measurement module 524 and controller 526 may be used to perform a closed-loop calibration to fine tune OCT circuit 504 for each channel in the IO circuitry until the OCT impedance is properly matched with the actual impedance of the external transmission line. Switch 522 may be closed to enable the feedback path for the closed-loop OCT calibration. During calibration, core logic circuitry 500 may be configured to output one or more voltage pulses that is propagated to the physical interface 506 via buffer 502 and OCT circuit 504.

While switch 522 is activated, waveform measurement module 524 may serve as a sampling scope that captures and characterizes a time-domain voltage pulse response associated with the core-logic-generated sequence of pulses that is being propagated to the physical interface 506. The sampled waveform obtained using measurement module 524 can be used to extract useful information such as the characteristic impedance $Z_L$ of the external transmission media. Measurement module 524 operated in this way may sometimes be referred to as an on-die measuring instrument (ODI). Measurement module 524 may therefore sometimes be referred to as being configured to monitor or characterize the external impedance (e.g., to determine whether $Z_L$ is greater than or less than termination impedance $Z_O$).

Control circuitry 526 may receive the sampled waveform and may perform analysis on the sampled waveform. By analyzing the sampled waveform, control circuitry 526 will be able to determine whether an impedance mismatch is present (e.g., whether $Z_O$ is equal to $Z_L$). In response to detecting an impedance mismatch, an adjustment signal $\delta\Omega$ may be provided to the second (2) input of the summing circuit 528 to adjust the impedance setting currently provided at the output of the initial settings register 510. Summing circuit 528 may combine the signals received at its input to generate a corresponding output signal for properly tuning the impedance of OCT circuit 504. For example, OCT control circuitry 526 may send adjustment signals that gradually increments the combined adjustment signal until an impedance match is obtained. As another example, OCT control circuitry 526 may send adjustment signals that monotonically decrements the combined adjustment signal until an impedance match is obtained. In other words, calibration will continue until measurement module 524 observes the desired voltage response that corresponds to a perfect impedance match. Once the external OCT calibration is complete, controller 526 may then deactivate switch 522 (e.g., by sending a deasserted enable signal to switch 522 via control path 530) to remove any undesired loading effect at the IO interface 506.

In some embodiments, the initial control setting provided by register 510 may be considered a "coarse" impedance tuning knob for adjusting the impedance $Z_O$ of circuit 504 with a first degree of accuracy, whereas the adjustment setting $\delta\Omega$ provided by controller 526 may be considered a "fine" impedance tuning knob for adjusting impedance $Z_O$ of circuit 504 with a second degree of accuracy that is greater than the first degree of accuracy. For example, the coarse impedance tuning settings may be configured to adjust $Z_O$ in increments of 15$\Omega$, whereas the fine impedance tuning settings may be configured to adjust $Z_O$ in increments of 1$\Omega$. As another example, the coarse impedance tuning settings may be configured to adjust $Z_O$ in increments of 25$\Omega$, whereas the fine impedance tuning settings may be configured to adjust $Z_O$ in increments of 5$\Omega$. These examples are merely illustrative. If desired, the control signals received at the first and second inputs of combiner 528 may adjust the IO buffer impedance in any desired increment/decrement.

Figure 6:
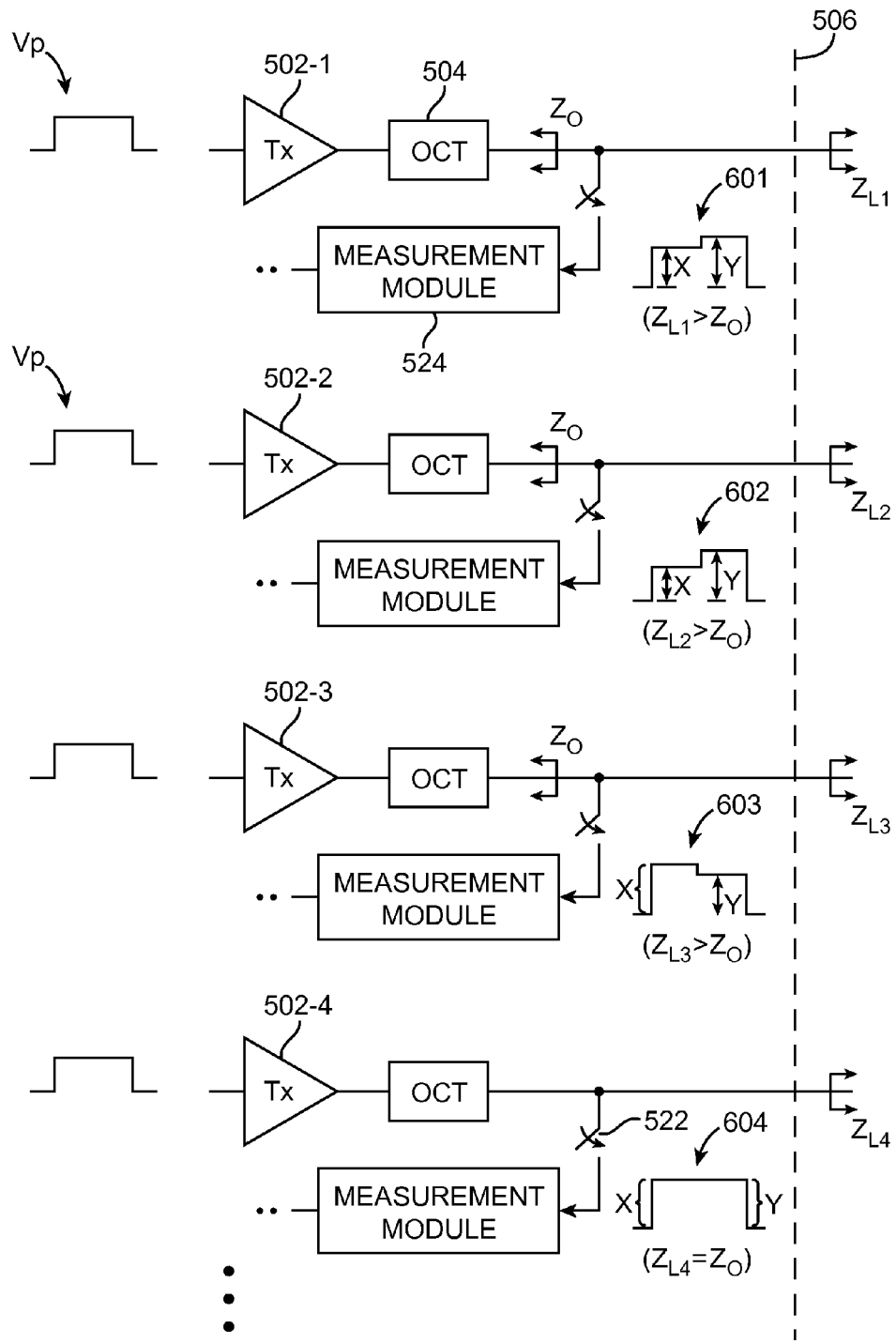
FIG. 6 is a diagram illustrating various voltage responses associated with different types of impedance mismatch that can be detected using waveform measurement modules within the adaptive external OCT calibration circuitry of FIG. 5 in accordance with an embodiment.

The configuration of FIG. 5 in which adaptive external OCT calibration circuitry 520 is operable to calibrate an IO channel is merely illustrative and does not serve to limit the scope of the present invention. FIG. 6 shows another suitable arrangement in which calibration circuitry 520 may include components for individually calibrating each channel in a plurality of channels, in parallel or sequentially. As shown in FIG. 6, a first channel may include a first IO buffer 502-1 and a first OCT circuit 504 that is coupled to a first measurement module 524 and other associated circuitry described in connection with FIG. 5 (not shown in FIG. 6 for the sake of clarity) via a first corresponding switch; a second channel may include a second IO buffer 502-1 and a second OCT circuit 504 that is coupled to a second measurement module 524 and other associated circuitry via a second corresponding switch; a third channel may include a third IO buffer 502-3 and a second OCT circuit that is coupled to a third measurement module 524 and other associated circuitry via a third corresponding switch; and a fourth channel may include a fourth IO buffer 502-4 and a fourth OCT circuit 504 that is coupled to a fourth measurement module 524 and other associated circuitry via a fourth corresponding switch.

During calibration, each of the IO buffers 502 may receive one or more voltage pulses Vp (e.g., a series of voltage pulse signals generated using storage and processing circuitry 202 of FIG. 2). Depending on whether the IO interface 506 is impedance matched, the voltage response that is detected by each respective measurement instrument 524 may be different. In the example of FIG. 6, the first measurement module 524 may sample a first waveform 601 having a first magnitude portion X and a second magnitude portion Y. This difference in magnitude may be a result of one or more signal reflections generated in response to an impedance mismatch. A corresponding waveform analyzer and controller may determine based on waveform 601 that the associated transmission line impedance $Z_{L1}$ is greater than $Z_O$ (e.g., by detecting that X is less than Y). In this scenario, the controller may issue corresponding adjustment settings to increment $Z_O$.

The second measurement module 524 may sample a second waveform 602 having magnitude portions X and Y. A corresponding waveform analyzer and controller (could be shared with the first measurement module or could be a separate circuit) may determine based on waveform 602 that the associated transmission line impedance $Z_{L2}$ is greater than $Z_O$ since X is less than Y. In this scenario, the controller may issue corresponding adjustment settings to increment $Z_O$.

The third measurement module 524 may sample a third waveform 603 having magnitude portions X and Y. A corresponding waveform analyzer and controller (could be shared with the first/second measurement module or could be a separate dedicated circuit) may determine based on waveform 603 that the associated transmission line impedance $Z_{L3}$ is actually less than $Z_O$ (e.g., by detecting that X is greater than Y). In this scenario, the controller may issue corresponding adjustment settings to decrement $Z_O$.

The fourth measurement module 524 may sample a fourth waveform 604 having magnitude portions X and Y. A corresponding waveform analyzer and controller (could be shared with the first/second/third measurement module or could be a separate standalone circuit) may determine based on waveform 604 that the associated transmission line impedance $Z_{L4}$ is properly matched with $Z_O$ (e.g., by detecting that X is equal to Y). In this scenario, the controller may proceed to disable the associated switch 522 since calibration is complete for that particular channel. In general, the IO circuitry may include any number of channels (e.g., less than four channels, more than four channels, more than ten channels, more than 100 channels, etc.).

The different types of voltage responses shown in FIG. 6 are merely illustrative. If desired, other types of signals not limited to a square pulse may be fed to the IO physical interface 506, other time-domain or frequency-domain responses can be observed using measurement modules 524, and other ways of determining whether an impedance match is obtained can be implemented.

Figure 7:
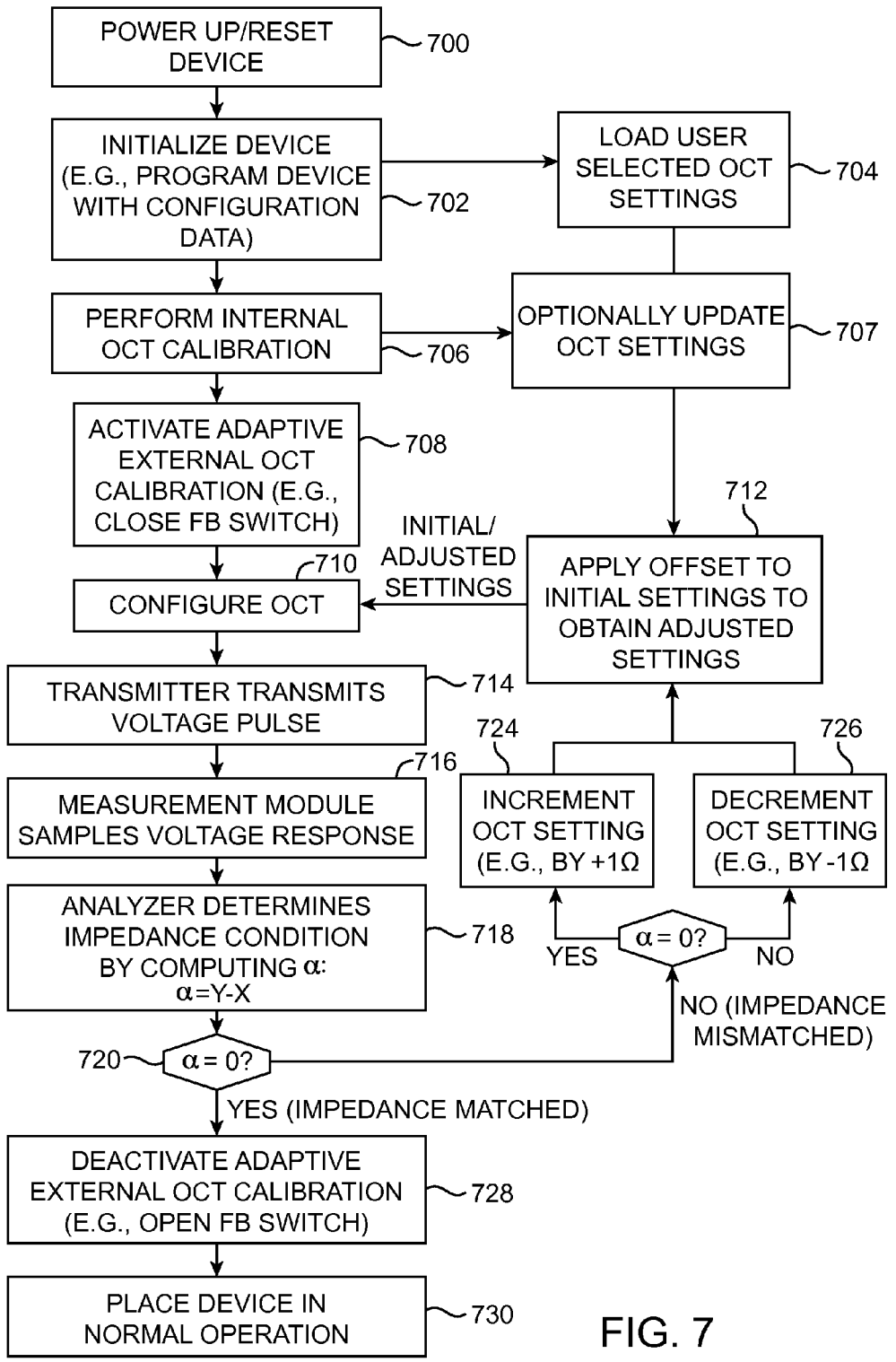
FIG. 7 is a flow chart of illustrative steps involved in calibrating input-output circuitry of the type shown in FIG. 5 in accordance with an embodiment.

FIG. 7 is a flow chart of illustrative steps involved in calibrating input-output circuitry of the type shown in FIG. 5. At step 700, the integrated circuit device 200 may be powered up or reset. At step 702, integrated circuit 200 (e.g., a programmable logic device) may be programmed using configuration data. For example, a configuration bit stream may be loaded into device 200 to configure the device to perform one or more custom logic functions. At step 704, the on-chip termination (OCT) circuit 504 may be configured to provide a user-selected impedance or other default impedance value.

At step 706, OCT calibration circuit 508 may be used to perform internal OCT calibration to optionally update the OCT impedance (step 707) based on the initial calibration results. The initial OCT settings may be selected based on the desired interface standard that is currently being supported by the integrated circuit (as an example).

At step 708, circuitry 520 may be activated to perform adaptive external OCT calibration (e.g., by closing feedback switch 522). At step 710, the OCT circuit 504 may be configured to provide an impedance based on the combined settings provided at the output of summing circuit 528.

At step 714, one or more voltage pulses (or other types of impulse response) may be generated at the output of the IO buffer and propagated to the physical IO interface. At step 716, measurement module 524 may be used to sample the corresponding voltage response waveform at the physical IO interface.

At step 718, waveform analyzer 526 may be used to determine the current impedance condition by identifying the type of reflection in the response waveform (e.g., by computing the difference between magnitude portions Y and X described in connection with FIG. 6). The difference between Y and X may be indicated as a (i.e., $\alpha$=Y-X). In response to detecting a positive a, controller 526 may then send an adjustment signal to increment the overall impedance $Z_O$ by 1Ω (or other increment step), as shown in step 724. In response to detecting a negative a, controller 526 may send an adjustment signal to decrement the overall impedance $Z_O$ by 1Ω (or other step value), as shown in step 726. Adjustment signals (or OCT offset settings) generated in this way can be combined with the initial OCT settings to obtain fine-tuned adjusted settings that can be used to update the impedance provided by the OCT circuit.

If $\alpha$ is equal to zero, controller 526 will recognize that an impedance match is achieved and may proceed to deactivate the feedback switch 522 (step 728). At step 730, integrated circuit device 200 may be placed in normal operation to help carry out the desired logic functions. The example of FIG. 7 in which difference a is compared to zero is merely illustrative and does not serve to limit the scope of the present invention. If desired, impedance matching may be identified when a is less than a predetermined threshold, whereas impedance mismatch may be determined when a is greater than the predetermined threshold. Other suitable ways of triggering fine OCT adjustments may also be implemented.

Dynamically calibrating the on-chip termination to match the external impedance in this way can help improve signal integrity perform while enhancing system flexibility (to enable the IO subsystem to function properly in a variety of operating conditions). If desired, the control circuitry 526 can also be configured to alert the user whenever impedance mismatch is detected. In other suitable embodiments, the adaptive external OCT calibration steps (e.g., steps 708-728) may be periodically performed to ensure continuous tracking of the external impedance over time. Moreover, the embodiments described herein in which the OCT calibration is performed on a transmit (Tx) path are merely illustrative and are not intended to limit the scope of the present invention. If desired, the techniques described herein can also be extended to cover external OCT calibration for the receive (Rx) path, for memory interfaces, for IO subsystems with similar types of feedback schemes, or other suitable types of IO circuitry.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit, comprising:
   an external interface buffer;
   an on-chip termination (OCT) circuit that is coupled to the external interface buffer and that provides a termination impedance;
   a measurement circuit that monitors the termination impedance of the on-chip termination circuit;
   control circuitry that dynamically adjusts the termination impedance of the on-chip termination circuit based on the monitored result at the measurement circuit; and
   a switch that is coupled in series between the on-chip termination circuit and the measurement circuit, wherein the measurement circuit is prevented from monitoring the termination impedance of the on-chip termination circuit when the switch is open.

2. The integrated circuit defined in claim 1, wherein the external interface buffer comprises a transmitter circuit.

3. The integrated circuit defined in claim 1, wherein the control circuitry is further configured to control activation of the switch.

4. The integrated circuit defined in claim 1, further comprising:
   a storage circuit storing settings corresponding to a predetermined set of termination impedance values for the on-chip termination circuit, wherein the termination impedance of the on-chip termination circuit is controlled at least partly based on an output of the storage circuit.

5. The integrated circuit defined in claim 4, further comprising:
a summing circuit having a first input that receives the output from the storage circuit, a second input that receives control signals from the control circuitry, and an output that is coupled to the on-chip termination circuit.

6. The integrated circuit defined in claim 1, wherein the control circuitry continues to adjust the termination impedance of the on-chip termination circuit until the termination impedance is matched with the impedance of a corresponding external transmission line that is coupled to the external interface buffer.

7. A method of operating an integrated circuit that includes an output driver and an impedance termination circuit that is coupled to the output driver, the method comprising:
using the output driver to communicate with an external transmission line;
with a measurement module, characterizing an impedance of the external transmission line;
with control circuitry, adjusting a termination impedance of the impedance termination circuit based on the characterized impedance of the external transmission line; and
with the control circuitry, turning off a switch that is coupled between the impedance termination circuit and the measurement module to prevent the measurement module from characterizing the impedance of the external transmission line.

8. The method defined in claim 7, further comprising:
during calibration, using the output driver to receive at least one pulse signal.

9. The method defined in claim 8, further comprising:
with the control circuitry, sampling a corresponding pulse response at the impedance termination circuit.

10. The method defined in claim 9, further comprising:
in response to detecting that the pulse response has a first characteristic, increasing the termination impedance of the impedance termination circuit with the control circuitry;
in response to detecting that the pulse response has a second characteristic that is different than the first characteristic, decreasing the termination impedance of the impedance termination circuit with the control circuitry.

11. The method defined in claim 7, further comprising:
with the control circuitry, turning on the switch only during calibration operations.

12. The method defined in claim 7, wherein adjusting the termination impedance of the impedance termination circuit comprises adjusting the termination impedance of the impedance termination circuit until the termination impedance of the impedance termination circuit is equal to the impedance of the external transmission line.

13. The method defined in claim 7, further comprising:
with an initial settings register, providing coarse impedance tuning, wherein the control circuit is used to provide fine impedance tuning that is more accurate than the coarse impedance tuning.

14. The method defined in claim 13, further comprising:
with a summing circuit, combining the coarse impedance tuning signals from the initial settings register with the fine impedance tuning signals from the control circuitry, wherein the termination impedance of the impedance termination circuit is adjusted based only on the sum of the coarse impedance tuning signals and the fine impedance tuning signals.

15. Input-output circuitry, comprising:
a transmit buffer coupled to an off-chip transmission line via an external interface;
an on-chip impedance termination circuit that has a termination impedance and that is formed at the external interface; and
adaptive on-chip termination calibration circuitry for dynamically adjusting the on-chip impedance termination circuit until the termination impedance of the on-chip impedance termination circuit matches with the impedance of the off-chip transmission line, wherein the adaptive on-chip termination calibration circuitry includes a measurement instrument for sampling a time-domain voltage pulse response at an output of the transmit buffer.

16. The input-output circuitry defined in claim 15, wherein the on-chip impedance termination circuit includes a plurality of capacitors, inductors, and resistors.

17. The input-output circuitry defined in claim 15, wherein the adaptive on-chip termination calibration circuitry is enabled only when the termination impedance of the on-chip impedance termination circuit is different from the impedance of the off-chip transmission line.

18. The input-output circuitry defined in claim 15, wherein the adaptive on-chip termination calibration circuitry further comprises:
an initial settings register for storing coarse impedance tuning settings; and
a summing circuit that combines the coarse impedance tuning settings with fine impedance tuning settings obtained based on the sampled waveform.

* * * * *